United States Patent
Bains et al.

(10) Patent No.: US 10,943,640 B2
(45) Date of Patent: *Mar. 9, 2021

(54) APPARATUS, METHOD AND SYSTEM FOR PROVIDING TERMINATION FOR MULTIPLE CHIPS OF AN INTEGRATED CIRCUIT PACKAGE

(71) Applicant: Intel Corporation, Santa Clara, CA (US)

(72) Inventors: Kuljit S. Bains, Olympia, WA (US); George Vergis, Portland, OR (US); James A. McCall, Portland, OR (US); Ge Chang, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/177,284

(22) Filed: Oct. 31, 2018

(65) Prior Publication Data

US 2019/0139592 A1    May 9, 2019

Related U.S. Application Data

(63) Continuation of application No. 14/440,068, filed as application No. PCT/US2013/071533 on Nov. 22, 2013, now Pat. No. 10,121,528.
(Continued)

(51) Int. Cl.
G06F 12/00     (2006.01)
G11C 11/4074   (2006.01)
(Continued)

(52) U.S. Cl.
CPC ........ G11C 11/4074 (2013.01); G06F 3/0604 (2013.01); G06F 3/0637 (2013.01);
(Continued)

(58) Field of Classification Search
CPC .. G11C 11/4074; G06F 3/0604; G06F 3/0637
See application file for complete search history.

(56) References Cited

U.S. PATENT DOCUMENTS 6,006,339 A    12/1999  McClure
6,466,496 B2   10/2002  Kuge
(Continued)

OTHER PUBLICATIONS

"PCT, International Search Report and Written Opinion of the International Searching Authority for International Application No. PCT/US2013/071533", (dated Mar. 14, 2014), Whole Document.
(Continued)

*Primary Examiner* — Baboucarr Faal
(74) *Attorney, Agent, or Firm* — Compass IP Law, PC

(57) ABSTRACT

Techniques and mechanisms for providing termination for a plurality of chips of a memory device. In an embodiment, a memory device is an integrated circuit (IC) package which includes a command and address bus and a plurality of memory chips each coupled thereto. Of the plurality of memory chips, only a first memory chip is operable to selectively provide termination to the command and address bus. Of the respective on-die termination control circuits of the plurality of memory chips, only the on-die termination control circuit of the first memory chip is coupled via any termination control signal line to any input/output (I/O) contact of the IC package. In another embodiment, the plurality of memory chips are configured in a series with one another, and wherein the first memory chip is located at an end of the series.

20 Claims, 6 Drawing Sheets

400

410

Coupling a plurality of memory chips each to a command and address bus, including, for each of the memory chips, coupling a respective on-die termination control circuit of the memory chip to the command and address bus

420

Coupling only a first memory chip to be operable to selectively provide termination to the command and address bus

Related U.S. Application Data

(60) Provisional application No. 61/731,908, filed on Nov. 30, 2012.

(51) Int. Cl.
  *G06F 3/06* (2006.01)
  *G11C 7/10* (2006.01)
  *G11C 8/06* (2006.01)
  *G06F 13/16* (2006.01)
  *G11C 11/408* (2006.01)

(52) U.S. Cl.
  CPC ........ *G06F 3/0673* (2013.01); *G06F 13/1663* (2013.01); *G11C 7/109* (2013.01); *G11C 7/1057* (2013.01); *G11C 7/1072* (2013.01); *G11C 7/1084* (2013.01); *G11C 8/06* (2013.01); *G11C 11/408* (2013.01)

(56) References Cited

U.S. PATENT DOCUMENTS

| | | |
|---|---|---|
| 6,597,202 B1 | 7/2003 | McCall et al. |
| 6,665,736 B1 | 12/2003 | Fan |
| 7,142,461 B2 | 11/2006 | Janzen |
| 2002/0165706 A1 | 11/2002 | Raynham |
| 2003/0126338 A1 | 7/2003 | Dodd et al. |
| 2005/0005184 A1 | 1/2005 | Lindt |
| 2005/0007835 A1 | 1/2005 | Lee et al. |
| 2005/0033905 A1 | 2/2005 | Leddige et al. |
| 2006/0106951 A1 | 5/2006 | Bains |
| 2007/0146004 A1 | 6/2007 | Park et al. |
| 2008/0080292 A1 | 4/2008 | Djordevic |
| 2008/0133809 A1 | 6/2008 | Saito et al. |
| 2009/0046534 A1 | 2/2009 | Ruckerbauer et al. |
| 2009/0303802 A1 | 12/2009 | Lee |
| 2009/0313410 A1 | 12/2009 | Jeong et al. |
| 2010/0020585 A1 | 1/2010 | Rajan |
| 2010/0027356 A1* | 2/2010 | Shaeffer ............ G11C 29/028 365/191 |
| 2010/0032820 A1 | 2/2010 | Bruennert et al. |
| 2010/0070696 A1 | 3/2010 | Blankenship |
| 2010/0327902 A1 | 12/2010 | Shau |
| 2011/0004709 A1 | 1/2011 | Gower et al. |
| 2011/0109344 A1* | 5/2011 | Choi ................ H03K 19/0005 326/30 |
| 2011/0249483 A1 | 10/2011 | Oh et al. |
| 2011/0314200 A1* | 12/2011 | Wilson ............. G06F 13/4086 710/316 |
| 2011/0316580 A1 | 12/2011 | McCall et al. |
| 2012/0117338 A1 | 5/2012 | Vaidyanath et al. |
| 2012/0173809 A1 | 7/2012 | Ko |
| 2012/0206165 A1 | 8/2012 | Ferolito et al. |
| 2013/0009318 A1 | 1/2013 | Chia et al. |
| 2013/0339775 A1 | 12/2013 | Shaeffer et al. |
| 2014/0141543 A1 | 5/2014 | Ide et al. |
| 2014/0232429 A1 | 8/2014 | Riho |
| 2014/0281200 A1 | 9/2014 | Maheshwari |
| 2016/0373111 A1 | 12/2016 | Shaeffer |
| 2017/0125092 A1* | 5/2017 | Hirashima ........... G11C 7/1084 |

OTHER PUBLICATIONS

European Search Report from European Patent Application No. 13857895.0 dated Jun. 13, 2016, 7 pgs.

First Preliminary Rejection for Korean Application No. 10-2015-7011398 dated Aug. 5, 2016, 4 pages.

International Preliminary Report on Patentability for International Application No. PCT/US2013/071533 dated Jun. 11, 2015, 11 pqs.

European First Office Action for Patent Application No. 13857895.0, dated Oct. 1, 2019, 5 pages.

Extended European Search Report for Patent Application No. 19217490.2, dated Mar. 10, 2020, 7 pages.

* cited by examiner

APPARATUS, METHOD AND SYSTEM FOR PROVIDING TERMINATION FOR MULTIPLE CHIPS OF AN INTEGRATED CIRCUIT PACKAGE

RELATED APPLICATION

This application is a continuation of U.S. patent application Ser. No. 14/440,068, filed Apr. 30, 2015, entitled "APPARATUS, METHOD AND SYSTEM FOR PROVIDING TERMINATION FOR MULTIPLE CHIPS OF AN INTEGRATED CIRCUIT PACKAGE", which is a U.S. National Stage Entry of International Patent Application No. PCT/US2013/071533, filed Nov. 22, 2013, entitled "APPARATUS, METHOD AND SYSTEM FOR PROVIDING TERMINATION FOR MULTIPLE CHIPS OF AN INTEGRATED CIRCUIT PACKAGE", which further claims priority to U.S. Provisional Patent Application No. 61/731,908 filed Nov. 30, 2012, all of which are incorporated by reference in their entirety.

BACKGROUND

1. Technical Field

The present invention relates to semiconductor chips and, more particularly, to providing signal termination for chips of a memory device.

2. Background Art

Conductors are typically terminated through resistive structures, such as resistive materials and transistors. The terminations have been positioned in various places. Examples of the location of terminations include on motherboards or other circuit boards or cards. Other examples of locations of terminations include on a chip that transmits a signal and/or on a chip that receives a signal. Terminations on the chip are commonly referred to as on die terminations (ODTs).

Dynamic random access memory (DRAM) chips are typically included in memory modules, some of which are dual in-line memory modules (DIMMS). The term rank refers to a group of memory chips that are selected together, for example, through a shared chip select signal or through some other way. Some modules include only one rank per module and some include more than one rank per module. Some ranks include chips on more than one module. In some two rank memory systems, for best electrical performance, ODT is selectively enabled on DRAM chips when those DRAM chips are not driving data for read operations.

BRIEF DESCRIPTION OF THE DRAWINGS

The various embodiments of the present invention are illustrated by way of example, and not by way of limitation, in the figures of the accompanying drawings and in which.

DETAILED DESCRIPTION

Embodiments discussed herein variously provide techniques and/or mechanisms for providing termination for a plurality of integrated circuit chips which are each coupled to a single bus. The bus may include a command and address bus of a memory device—e.g. an integrated circuit package—which also includes the plurality of chips.

In an embodiment, a first memory chip is the only memory chip of a plurality of memory chips which is operable to selectively provide termination to a command and address bus which is coupled to each of the plurality of memory chips. For example, the plurality of memory chips may each include a respective on-die termination control circuit which corresponds to—e.g. is coupled to—the command and address bus. Of the respective on-die termination control circuits of the plurality of memory chips, the on-die termination control circuit of the first memory chip—e.g. where the first memory chip is a last in a sequence of memory chips—may be the only on-die termination control circuit which is coupled via any termination control signal line to any input/output (I/O) contact of the memory device.

Embodiments discussed herein variously provide an efficient way to implement bus termination—e.g. command/address bus termination—for multiple chips of an IC package. For example, certain embodiments allow for the use of a relatively low number of I/O contacts of an IC package (as compared to previous techniques) for controlling termination for multiple chips of that IC package. Moreover, such efficient use of I/O contacts may be achieved without requiring, for example, that IC manufacturers include a particular type of on-die termination control circuit in only some of such multiple chips. This allows IC manufacturers to simply fabricate comparatively homogenous memory chips, for example, and then subsequently select during a packaging stage which of such memory chips is to be selectable to either provide bus termination or to prevent such termination being provided.

As multiple memory dies share a common high speed command and address bus within a stacked memory package, the need to properly terminate the bus becomes critical to support high signaling rates. However, due to physical restrictions for stacked memory packages, the number of input/output (I/O) contacts—e.g. pins, pads, balls or the like—available on the package for external command buses becomes constrained.

Figure 1A:
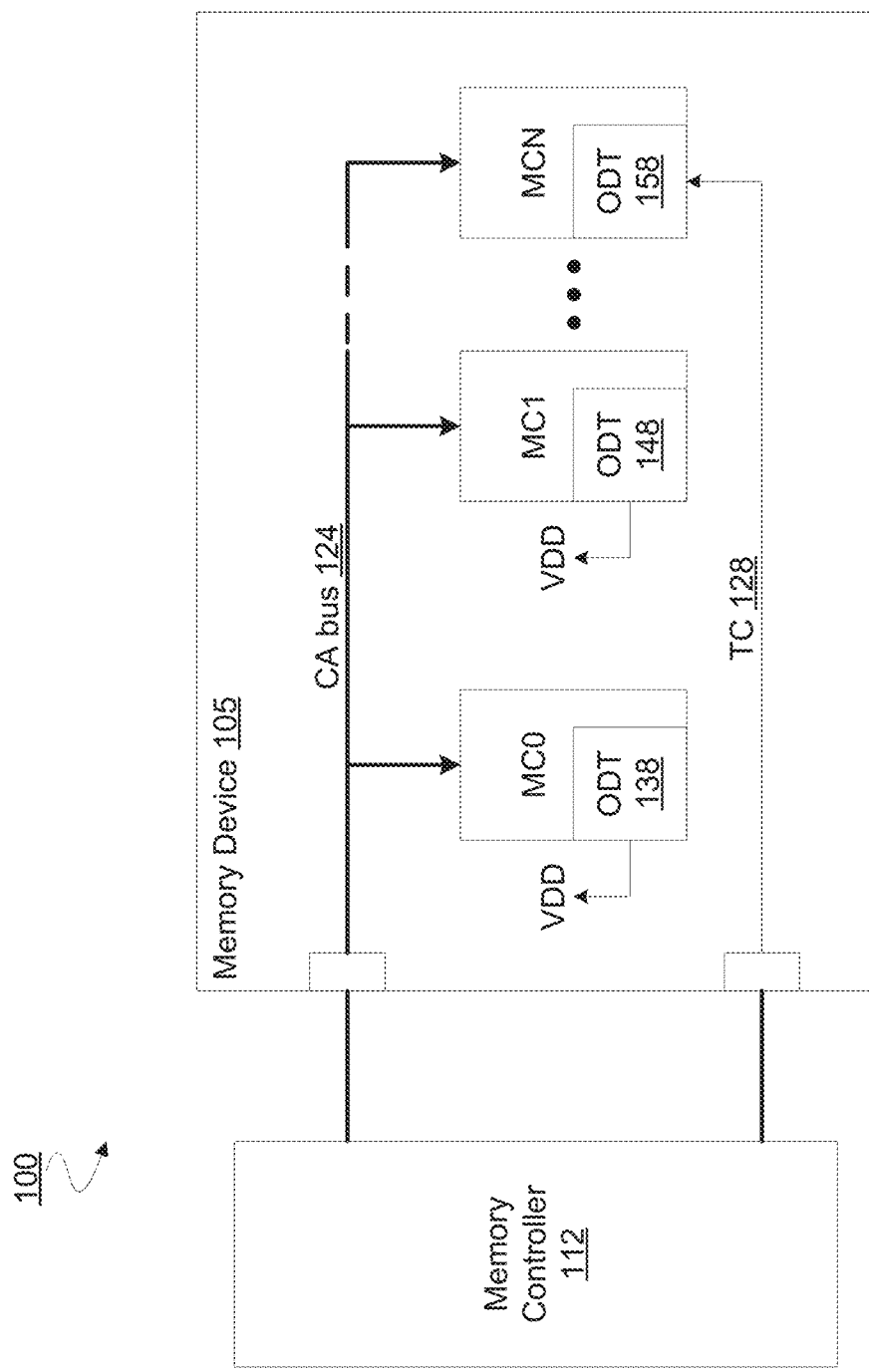
FIGS. 1A and 1B are illustrating elements of a system for controlling termination for a plurality of semiconductor chips according to an embodiment.

Referring to FIG. 1A, a memory controller 112 variously provides signals including command signals (hereinafter called commands) and/or address signals to a memory device 105. Various signals pass through interconnects between memory controller 112 and memory device 105. Data, addresses, commands and/or chip select signals, for example, may be exchanged on different input/output interconnect conductors or may be shared on at least some of the same such interconnect conductors. Signals of different types may be carried on different interconnects or the signals may be fully or partially packetized or time multiplexed over the same conductors in such interconnects.

In an embodiment, memory device 105 is or includes a single IC package which comprises a plurality of memory chips—e.g. including the illustrative chips MC0, MC1, . . . , MCN. The plurality of memory chips MC0, MC1, . . . , MCN may share a common command and address bus of the IC package—e.g. the illustrative CA bus 124—to receive command signals and/or address signals based on communications from memory controller 112. For example, memory chips MC0, MC1, . . . , MCN may be stacked or variously configured with respect to one another for each memory chip to have a different respective one or more connections to CA bus 124.

In an embodiment, the plurality of memory chips MC0, MC1, . . . , MCN each include a respective termination control circuit including structures capable of providing on-die termination for a corresponding connection or connections to CA bus 124. By way of illustration and not limitation, MC0, MC1, . . . , MCN may include respective on-die termination (ODT) control circuits 138, 148, . . . , 158. Each of ODT control circuits 138, 148, . . . , 158 may comprise one or more respective circuit elements operable to transition between a respective first termination state for providing termination for CA bus 124 and a respective second termination state to prevent the provisioning of such termination.

However, in an embodiment, only one of MC0, MC1, . . . , MCN is coupled to be selectable for either providing termination to CA bus 124 or preventing the provisioning of such termination. For example, ODT control circuits 138, 148, . . . , 158 may include only one ODT control circuit—e.g. ODT control circuit 158—which is coupled to avail of both of its two possible termination states. By way of illustration and not limitation, ODT control circuit 158 may be coupled to be selectable for configuration in either of two termination states by a termination control (TC) signal 128. For example, memory device 105 may be an IC package including I/O contacts (e.g. pin, pad, ball, etc.), where TC signal 128 can be variously asserted or deasserted based on an input signal provided at one such I/O contact. By contrast, the other ODT control circuits 138, 148, . . . etc. sharing CA bus 124 may be communicatively isolated from TC 128 or any other such termination control signal line (or corresponding I/O contact). For example, the other ODT control circuits 138, 148, . . . etc. may have respective inputs which are each coupled to a supply voltage VDD or other such fixed voltage level (e.g. ground) to keep the other ODT control circuits 138, 148, . . . etc. each in a respective deterministic termination state and value. As a result, the ODT control circuits 138, 148, . . . etc. other than ODT control circuit 158 may each be kept in a respective termination state which does not provide termination for CA bus 124. Alternatively or in addition, some or all of these other ODT control circuits 138, 148, . . . etc. may be variously floated in a respective tristate which prevents the providing of termination for CA bus 124 by such other ODT control circuits.

Figure 1B:
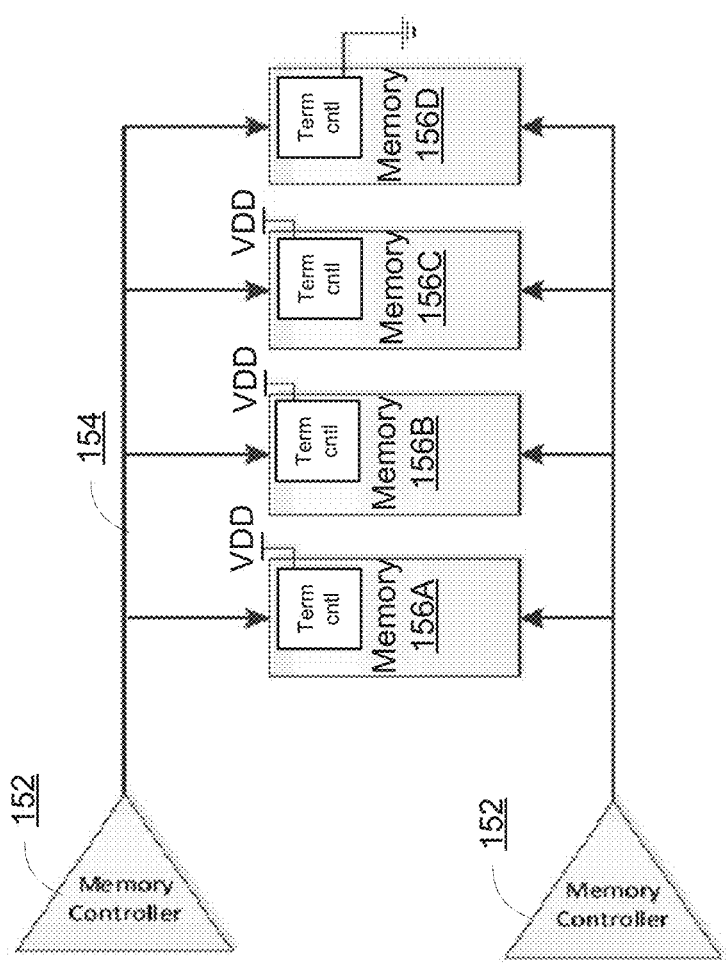

FIG. 1B is a block diagram of a memory package including a plurality of memory die illustrating on package termination control setting. The memory dies 156A-156D are coupled with the memory controller 152 via bus 154. Termination is located on each memory die (on-die termination) in the package. In this example, optimal signaling rates dictate the last device in the bus to engage its termination. Typically, the termination is accomplished by a specific control signal(s) which is connected to each memory die in the package and connected to a host memory controller. In an embodiment of the present invention, the need for dedicated termination signal(s) is obviated by allowing a device manufacturer to select the die to be terminated during package assembly. Per signaling the optimization the die to be terminated is the last die on the bus 154. The die to be terminated ("terminating device") is selected during package assembly by strapping the On Die Termination (ODT) signal on the last die (e.g., memory die 156D) in the bus to ground. The ODT signal is strapped inside the package and is not available outside the package. The termination control on the die can be strapped to Power (Disable) or Ground (Enabled) on a per die basis. For example, if there are four dies in a package and die number 4 is the last device on the bus (end device), die number 4 is strapped to ground (termination on). The other three dies in this example have termination control tied to power (VDD) (Termination off). Additionally, the package has programmable settings that can override the termination behavior implied by the strapping configuration in the package.

Figure 2:
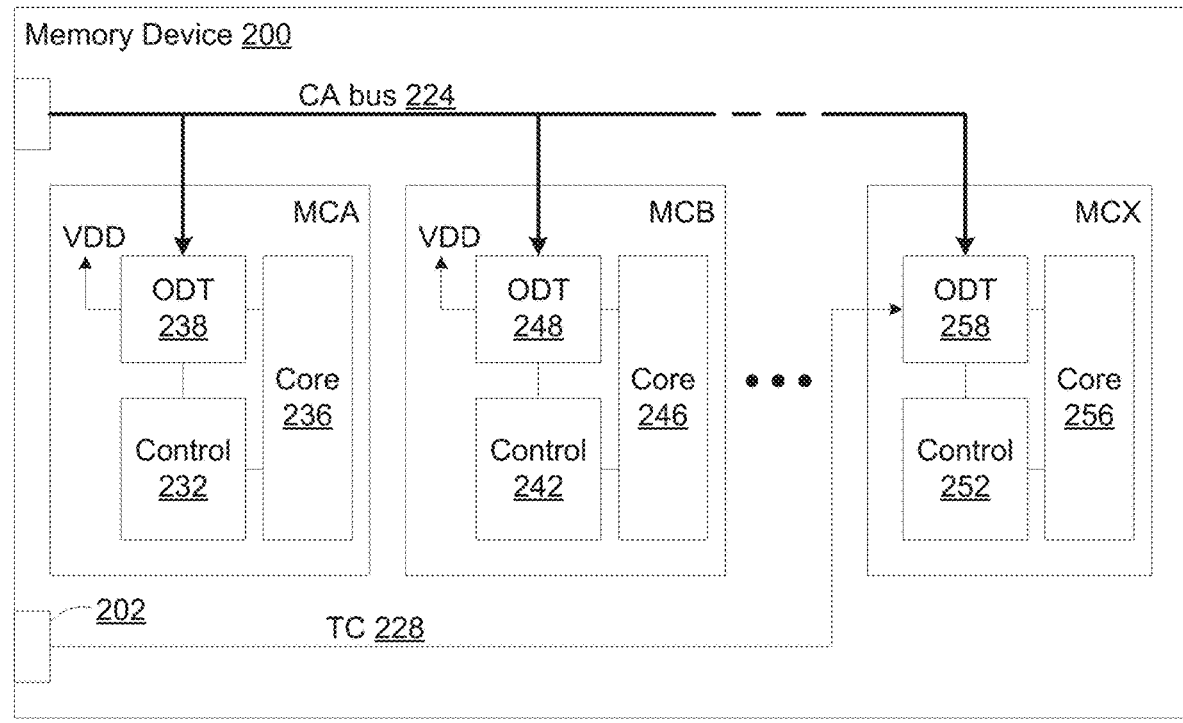
FIG. 2 is a block diagram illustrating elements of a memory device including semiconductor chips sharing a bus termination according to an embodiment.

FIG. 2 illustrates elements of a memory device 200 to provide termination for a plurality of memory chips according to an embodiment. Memory device 200 may include some or all of the features of memory device 105, for example.

By way of illustration and not limitation, memory device 200 may include memory chips MCA, MBC, . . . , MCX which correspond functionally to MC1, MC2, . . . , MCX. Memory chips MCA, MBC, . . . , MCX may include respective ODT control circuits 238, 248, . . . , 258 having some or all of the features of ODT control circuits 138, 148, . . . , 158. For example, MCA, MBC, . . . , MCX may each be coupled to a common CA bus 224 of memory device 200. For MCA, control circuitry 232 controls access to a core 236 of memory cells based on signaling received via CA bus 224. Similarly, control circuitry 242 of MCB controls access to a core 246 of memory cells based on signaling on CA bus 224, and control circuitry 252 of MCX controls access to a core 256 of memory cells based on signaling on CA bus 224.

ODT control circuits 238, 248, . . . , 258 may each include respective structures which are capable of transitioning between respective termination states—e.g. including a state for providing termination for CA bus 224 and another state to prevent such termination being provided for CA bus 224. However, in one embodiment, only one of ODT control circuits 238, 248, . . . , 258 is coupled to any signaling mechanism which enables that ODT control circuit to selectively implement either of its two possible termination states.

For example, MC1, MC2, . . . , MCX may be stacked or otherwise configured in relation to one another in a sequence, where CA bus 224 variously connects to respective ones of MC1, MC2, . . . , MCX according to that sequence at different points along a line. In an embodiment, the last memory chip of such a sequence—in this example, MCX—is the only memory chip of MC1, MC2, . . . , MCX which has an ODT control circuit selectively operable to either provide or prevent termination for CA bus 224. For example, memory device 200 may be an IC package, where—of ODT control circuits 238, 248, . . . , 258—only ODT control circuit 258 may be coupled to an I/O contact of the IC package. As shown, ODT control circuit 258 is coupled via a termination control (TC) signal 228 to an I/O contact 202.

Figure 3:
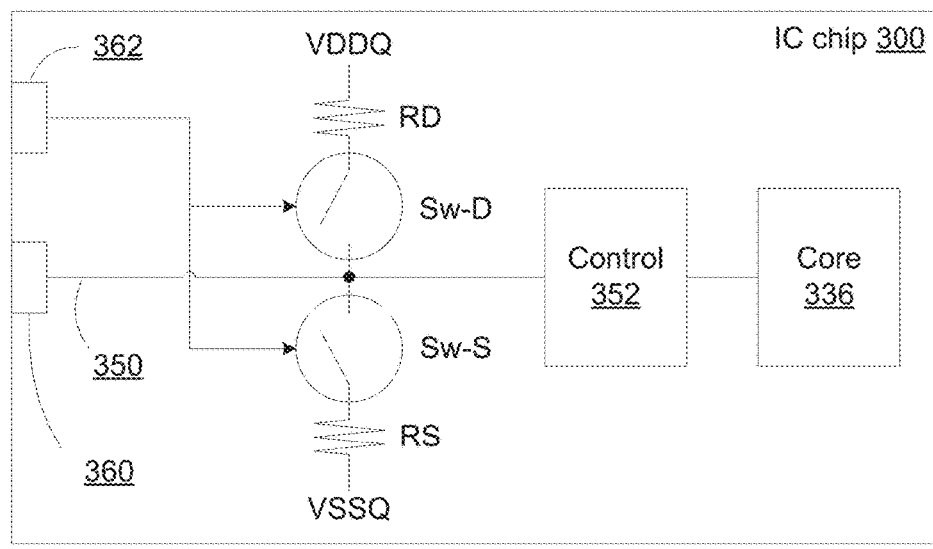
FIG. 3 is a hybrid circuit-block diagram illustrating elements of an integrated circuit chip according to an embodiment.

There are various possible architectures for ODT control circuitry of an individual memory chip, and certain embodiments are not limited in this regard. FIG. 3 shows elements of an IC chip 300 which includes illustrative ODT control circuitry, although various other types of ODT circuitry may be used. IC chip 300 may include some of all of the features of one of MC0, MC1, ..., MCN of memory device 200, for example.

Referring to FIG. 3, a resistive load RD and a switch Sw-D may be coupled in series with one another between a node 350 and a supply voltage node VDDQ. Alternatively or in addition, another resistive load RS and a switch Sw-S may be coupled in series with one another between node 350 and a ground voltage node VSSQ. Control signaling may be provided to control either or both of switches Sw-D, Sw-S and hence whether ODT is "on" or "off" By way of illustration and not limitation, IC chip 300 may receive via a contact 362 a signal to control both switches Sw-D and Sw-S to selectively provide termination for node 350. In FIG. 3, node 350 is between an I/O contact 360 (e.g. a pad) of IC chip 300 and control logic 352 for providing access to a memory core 336. In an embodiment, I/O contact 360 is to couple to a signal line of a command/address bus which is for exchanging commands and/or address signals with IC chip 300.

Figure 4A:
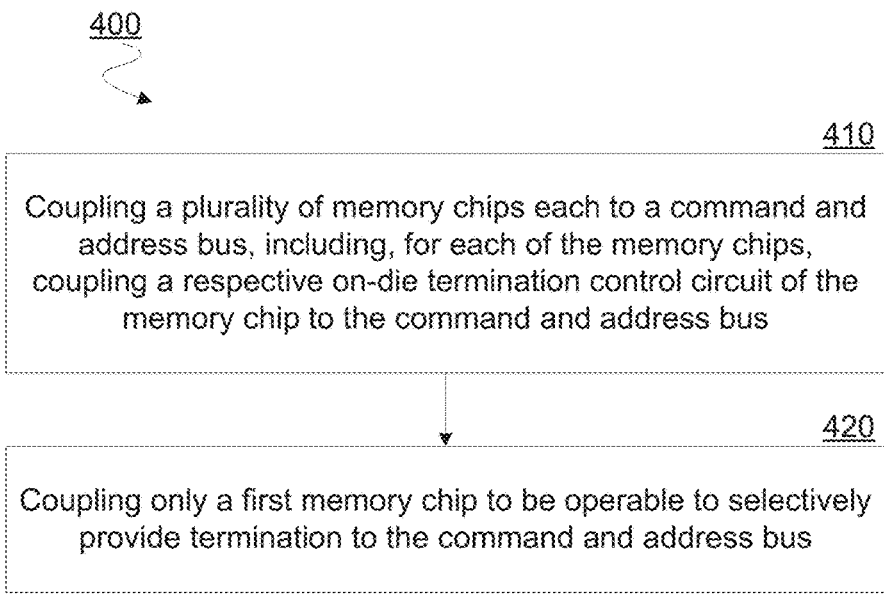
FIG. 4A is a flow diagram illustrating elements of a method for fabricating a memory device according to an embodiment.

FIG. 4A illustrates elements of a method 400 for fabricating memory device according to an embodiment. Method 400 may be performed to fabricate an integrated circuit (IC) package having some or all of the features of memory device 105—e.g. where the IC package includes features of memory device 200.

Method 400 includes, at 410, coupling a plurality of memory chips each to a command and address bus. The coupling at 410 may include, for each of the memory chips, coupling a respective on-die termination control circuit of the memory chip to the command and address bus. The plurality of memory chips may include one or more dynamic random access memory (DRAM) chips, for example. In an embodiment, the coupling at 410 includes configuring the plurality of memory chips in a series with one another. For example, the plurality of memory chips may be stacked with one another—e.g. according to techniques adapted from conventional die stacking processes.

Method 400 may further comprise, of the plurality of memory chips, coupling only a first memory chip, at 420, to be operable to selectively provide termination to the command and address bus. In an embodiment, of the respective on-die termination control circuits of the plurality of memory chips, only the on-die termination control circuit of the first memory chip is coupled via any termination control signal line to any input/output (I/O) contact of the IC package. For example, method 400 may include one or more other operations (not shown) which include, for each of the plurality of memory chips other than the first memory chip, hardwiring an input of the on-die termination control circuit of the memory chip to a supply voltage line, a reference voltage (e.g. ground) line or other such line to disable an ability of the on-die termination control circuit to transition between termination states. In an embodiment, the plurality of memory chips are stacked or otherwise configured in series with one another, wherein the first memory chip is located at one end of the series. For example, the first memory chip may be a last memory chip of all memory chips coupled to the command and address bus. More particularly, the first memory chip may be coupled to the command and address bus at a point which, relative to the others of the plurality of memory chips, is farthest away from the I/O contacts of the IC package.

Figure 4B:
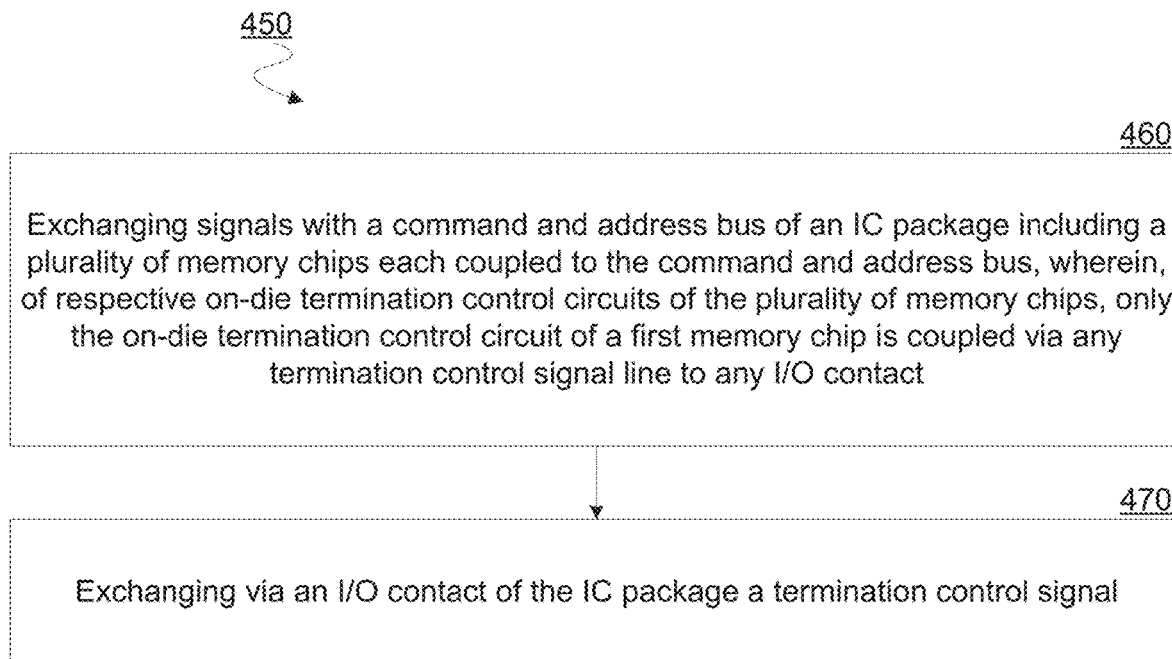
FIG. 4B is a flow diagram illustrating elements of a method for operating a memory device according to an embodiment.

FIG. 4B illustrates elements of a method 450 for operating a memory device according to an embodiment. Method 450 may operate a memory device such as one fabricated according to method 400, for example. By way of illustration and not limitation, method 450 may be variously performed by memory controller 112, memory device 105, memory device 200 and/or the like.

Method 450 may include, at 460, exchanging signals with a command and address bus of an integrated circuit (IC) package, wherein a plurality of memory chips of the IC package are each coupled to the command and address bus. In an embodiment, each of the plurality of memory chips includes a respective on-die termination control circuit corresponding to the command and address bus, wherein, of the respective on-die termination control circuits of the plurality of memory chips, only the on-die termination control circuit of a first memory chip is coupled via any termination control signal line to any input/output (I/O) contact of the IC package.

Method 450 may further comprise, at 470, exchanging via an I/O contact of the IC package a termination control signal, wherein the on-die termination control circuit of the first memory chip transitions between termination states in response to the termination control signal. Such termination states may include a first termination state to provide a termination for a signal line of the command and address bus and a second termination state to prevent such termination from being provided for the signal line of the command and address bus.

Figure 5:
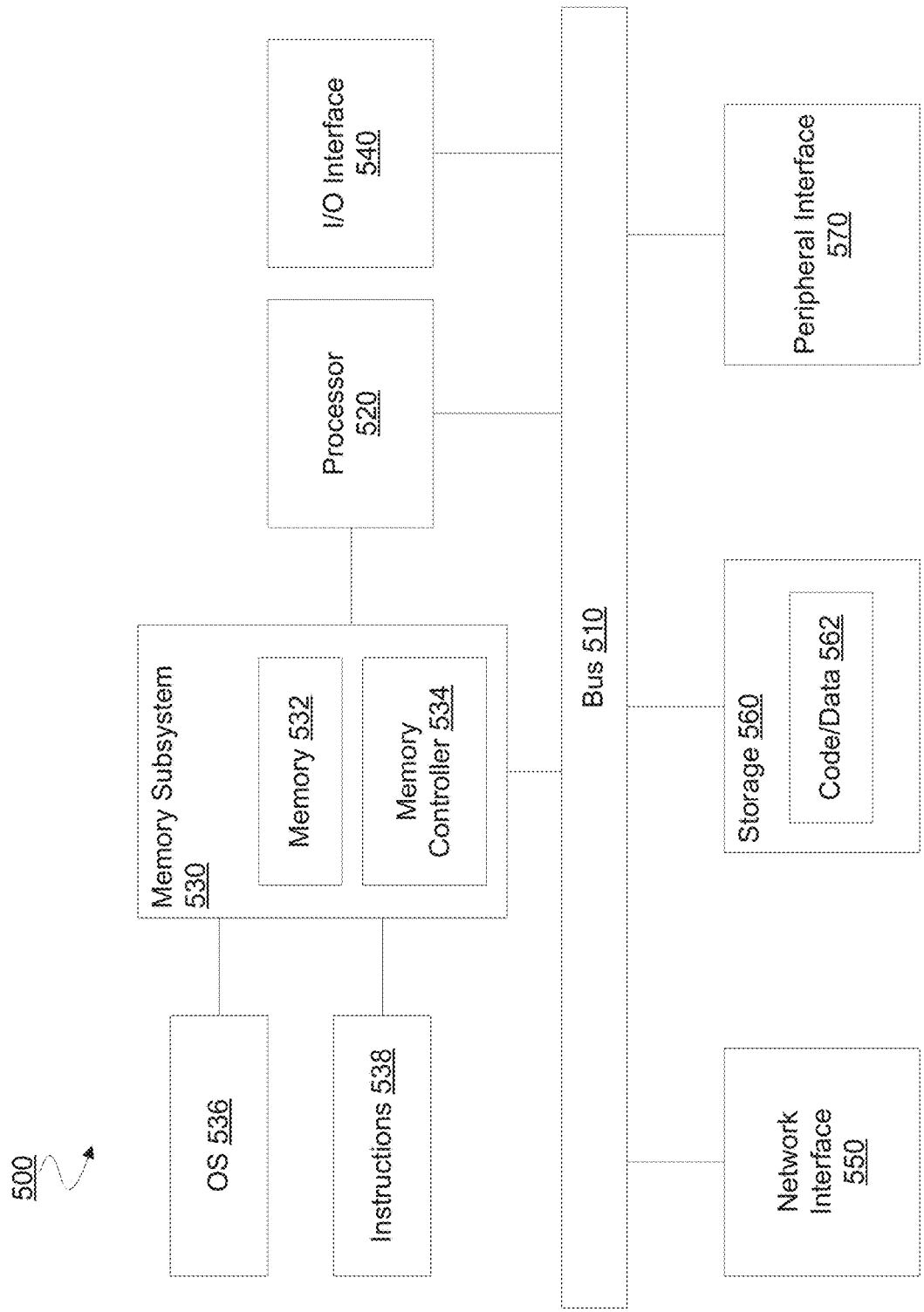
FIG. 5 is a block diagram illustrating elements of a computing system to control termination for an integrated circuit package according to an embodiment.

FIG. 5 is a block diagram of an embodiment of a computing system in which termination for multiple memory chips can be implemented. System 500 represents a computing device in accordance with any embodiment described herein, and can be a laptop computer, a desktop computer, a server, a gaming or entertainment control system, a scanner, copier, printer, routing or switching device, or other electronic device. System 500 includes processor 520, which provides processing, operation management, and execution of instructions for system 500. Processor 520 can include any type of microprocessor, central processing unit (CPU), processing core, or other processing hardware to provide processing for system 500. Processor 520 controls the overall operation of system 500, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

Memory subsystem 530 represents the main memory of system 500, and provides temporary storage for code to be executed by processor 520, or data values to be used in executing a routine. Memory subsystem 530 can include one or more memory devices such as read-only memory (ROM), flash memory, one or more varieties of random access memory (RAM), or other memory devices, or a combination of such devices. Memory subsystem 530 stores and hosts, among other things, operating system (OS) 536 to provide a software platform for execution of instructions in system 500. Additionally, other instructions 538 are stored and executed from memory subsystem 530 to provide the logic and the processing of system 500. OS 536 and instructions 538 are executed by processor 520.

Memory subsystem 530 includes memory device 532 where it stores data, instructions, programs, or other items. In one embodiment, memory subsystem includes memory controller 534, which is a memory controller in accordance with any embodiment described herein, and which includes a scheduler to generate and issue commands to memory device 532.

Processor 520 and memory subsystem 530 are coupled to bus/bus system 510. Bus 510 is an abstraction that represents any one or more separate physical buses, communication lines/interfaces, and/or point-to-point connections, connected by appropriate bridges, adapters, and/or controllers. Therefore, bus 510 can include, for example, one or more of a system bus, a Peripheral Component Interconnect (PCI) bus, a HyperTransport or industry standard architecture (ISA) bus, a small computer system interface (SCSI) bus, a universal serial bus (USB), or an Institute of Electrical and Electronics Engineers (IEEE) standard 1394 bus (commonly referred to as "Firewire"). The buses of bus 510 can also correspond to interfaces in network interface 550.

System 500 also includes one or more input/output (I/O) interface(s) 540, network interface 550, one or more internal mass storage device(s) 560, and peripheral interface 570 coupled to bus 510. I/O interface 540 can include one or more interface components through which a user interacts with system 500 (e.g., video, audio, and/or alphanumeric interfacing). Network interface 550 provides system 500 the ability to communicate with remote devices (e.g., servers, other computing devices) over one or more networks. Network interface 550 can include an Ethernet adapter, wireless interconnection components, USB (universal serial bus), or other wired or wireless standards-based or proprietary interfaces.

Storage 560 can be or include any conventional medium for storing large amounts of data in a nonvolatile manner, such as one or more magnetic, solid state, or optical based disks, or a combination. Storage 560 holds code or instructions and data 562 in a persistent state (i.e., the value is retained despite interruption of power to system 500). Storage 560 can be generically considered to be a "memory," although memory 530 is the executing or operating memory to provide instructions to processor 520. Whereas storage 560 is nonvolatile, memory 530 can include volatile memory (i.e., the value or state of the data is indeterminate if power is interrupted to system 500).

Peripheral interface 570 can include any hardware interface not specifically mentioned above. Peripherals refer generally to devices that connect dependently to system 500. A dependent connection is one where system 500 provides the software and/or hardware platform on which operation executes, and with which a user interacts.

Figure 6:
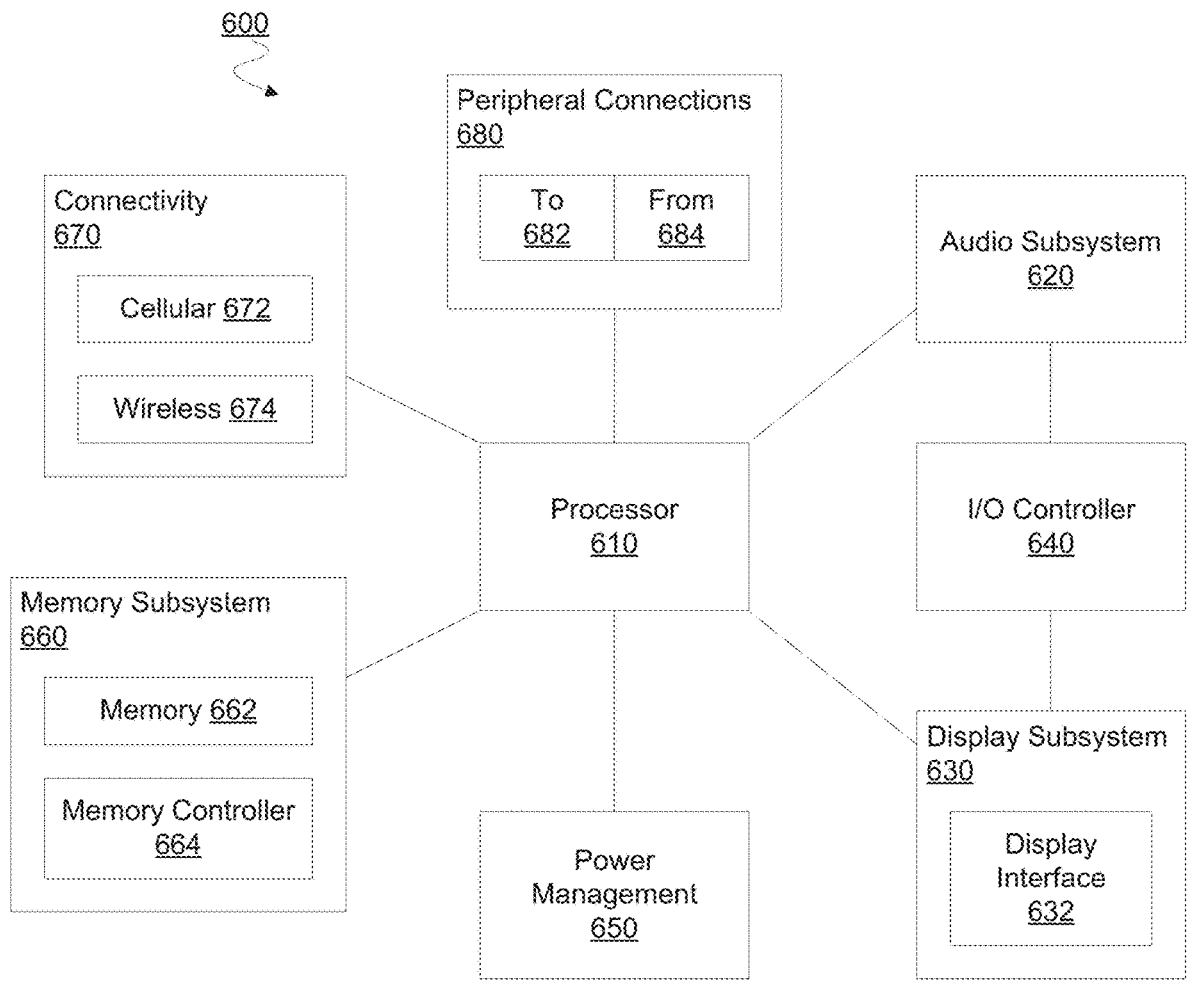
FIG. 6 is a block diagram illustrating elements of a mobile device to control termination for an integrated circuit package according to an embodiment.

FIG. 6 is a block diagram of an embodiment of a mobile device in which termination for multiple memory chips may be implemented. Device 600 represents a mobile computing device, such as a computing tablet, a mobile phone or smartphone, a wireless-enabled e-reader, or other mobile device. It will be understood that certain of the components are shown generally, and not all components of such a device are shown in device 600.

Device 600 includes processor 610, which performs the primary processing operations of device 600. Processor 610 can include one or more physical devices, such as microprocessors, application processors, microcontrollers, programmable logic devices, or other processing means. In one embodiment, processor 610 includes optical interface components in addition to a processor die. Thus, the processor die and photonic components are in the same package. Such a processor package can interface optically with an optical connector in accordance with any embodiment described herein.

The processing operations performed by processor 610 include the execution of an operating platform or operating system on which applications and/or device functions are executed. The processing operations include operations related to I/O (input/output) with a human user or with other devices, operations related to power management, and/or operations related to connecting device 600 to another device. The processing operations can also include operations related to audio I/O and/or display I/O.

In one embodiment, device 600 includes audio subsystem 620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into device 600, or connected to device 600. In one embodiment, a user interacts with device 600 by providing audio commands that are received and processed by processor 610.

Display subsystem 630 represents hardware (e.g., display devices) and software (e.g., drivers) components that provide a visual and/or tactile display for a user to interact with the computing device. Display subsystem 630 includes display interface 632, which includes the particular screen or hardware device used to provide a display to a user. In one embodiment, display interface 632 includes logic separate from processor 610 to perform at least some processing related to the display. In one embodiment, display subsystem 630 includes a touchscreen device that provides both output and input to a user.

I/O controller 640 represents hardware devices and software components related to interaction with a user. I/O controller 640 can operate to manage hardware that is part of audio subsystem 620 and/or display subsystem 630. Additionally, I/O controller 640 illustrates a connection point for additional devices that connect to device 600 through which a user might interact with the system. For example, devices that can be attached to device 600 might include microphone devices, speaker or stereo systems, video systems or other display device, keyboard or keypad devices, or other I/O devices for use with specific applications such as card readers or other devices.

As mentioned above, I/O controller 640 can interact with audio subsystem 620 and/or display subsystem 630. For example, input through a microphone or other audio device can provide input or commands for one or more applications or functions of device 600. Additionally, audio output can be provided instead of or in addition to display output. In another example, if display subsystem includes a touchscreen, the display device also acts as an input device, which can be at least partially managed by I/O controller 640. There can also be additional buttons or switches on device 600 to provide I/O functions managed by I/O controller 640.

In one embodiment, I/O controller 640 manages devices such as accelerometers, cameras, light sensors or other environmental sensors, gyroscopes, global positioning system (GPS), or other hardware that can be included in device 600. The input can be part of direct user interaction, as well as providing environmental input to the system to influence its operations (such as filtering for noise, adjusting displays for brightness detection, applying a flash for a camera, or other features).

In one embodiment, device 600 includes power management 650 that manages battery power usage, charging of the battery, and features related to power saving operation. Memory subsystem 660 includes memory device(s) 662 for storing information in device 600. Memory subsystem 660 can include nonvolatile (state does not change if power to the memory device is interrupted) and/or volatile (state is indeterminate if power to the memory device is interrupted) memory devices. Memory 660 can store application data, user data, music, photos, documents, or other data, as well as system data (whether long-term or temporary) related to the execution of the applications and functions of system 600.

In one embodiment, memory subsystem 660 includes memory controller 664 (which could also be considered part of the control of system 600, and could potentially be considered part of processor 610). Memory controller 664 includes a scheduler to generate and issue commands to memory device 662.

Connectivity 670 includes hardware devices (e.g., wireless and/or wired connectors and communication hardware) and software components (e.g., drivers, protocol stacks) to enable device 600 to communicate with external devices. The device could be separate devices, such as other computing devices, wireless access points or base stations, as well as peripherals such as headsets, printers, or other devices.

Connectivity 670 can include multiple different types of connectivity. To generalize, device 600 is illustrated with cellular connectivity 672 and wireless connectivity 674. Cellular connectivity 672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 674 refers to wireless connectivity that is not cellular, and can include personal area networks (such as Bluetooth), local area networks (such as WiFi), and/or wide area networks (such as WiMax), or other wireless communication. Wireless communication refers to transfer of data through the use of modulated electromagnetic radiation through a non-solid medium. Wired communication occurs through a solid communication medium.

Peripheral connections 680 include hardware interfaces and connectors, as well as software components (e.g., drivers, protocol stacks) to make peripheral connections. It will be understood that device 600 could both be a peripheral device ("to" 682) to other computing devices, as well as have peripheral devices ("from" 684) connected to it. Device 600 commonly has a "docking" connector to connect to other computing devices for purposes such as managing (e.g., downloading and/or uploading, changing, synchronizing) content on device 600. Additionally, a docking connector can allow device 600 to connect to certain peripherals that allow device 600 to control content output, for example, to audiovisual or other systems.

In addition to a proprietary docking connector or other proprietary connection hardware, device 600 can make peripheral connections 680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

In one implementation, an integrated circuit (IC) package comprises a command and address bus, and a plurality of memory chips each coupled to the command and address bus, each of the plurality of memory chips including a respective on-die termination control circuit corresponding to the command and address bus. Of the plurality of memory chips, only a first memory chip is operable to selectively provide termination to the command and address bus. Of the respective on-die termination control circuits of the plurality of memory chips, only the on-die termination control circuit of the first memory chip is coupled via any termination control signal line to any input/output (I/O) contact of the IC package.

In an embodiment, the plurality of memory chips are configured in a series with one another, and wherein the first memory chip is located at an end of the series. In another embodiment, the first memory chip is a last memory chip in a series of all memory chips coupled to the command and address bus. In another embodiment, for each of the plurality of memory chips other than the first memory chip, the on-die termination control circuit of the memory chip is hardwired to a supply voltage line. In another embodiment, the plurality of memory chips include one or more dynamic random access memory (DRAM) chips.

In another implementation, a method of fabricating an integrated circuit (IC) package comprises coupling a plurality of memory chips each to a command and address bus, including, for each of the memory chips, coupling a respective on-die termination control circuit of the memory chip to the command and address bus. The method further comprises, of the plurality of memory chips, coupling only a first memory chip to be operable to selectively provide termination to the command and address bus, wherein, of the respective on-die termination control circuits of the plurality of memory chips, only the on-die termination control circuit of the first memory chip is coupled via any termination control signal line to any input/output (I/O) contact of the IC package.

In an embodiment, coupling the plurality of memory chips each to the command and address bus includes configuring the plurality of memory chips in a series with one another, wherein the first memory chip is located at an end of the series. In another embodiment, the first memory chip is a last memory chip in a series of all memory chips coupled to the command and address bus. In another embodiment, the method further comprises, for each of the plurality of memory chips other than the first memory chip, hardwiring the on-die termination control circuit of the memory chip a supply voltage line. In another embodiment, the plurality of memory chips include one or more dynamic random access memory (DRAM) chips.

In another implementation, a method comprises exchanging signals with a command and address bus of an integrated circuit (IC) package, wherein a plurality of memory chips of the IC package are each coupled to the command and address bus, each of the plurality of memory chips including a respective on-die termination control circuit corresponding to the command and address bus. Of the respective on-die termination control circuits of the plurality of memory chips, only the on-die termination control circuit of a first memory chip is coupled via any termination control signal line to any input/output (I/O) contact of the IC package. The method further comprises exchanging via an I/O contact of the IC package a termination control signal, wherein the on-die termination control circuit of the first memory chip transitions between termination states in response to the termination control signal.

In an embodiment, the plurality of memory chips are configured in a series with one another, and wherein the first memory chip is located at an end of the series. In another embodiment, the first memory chip is a last memory chip in a series of all memory chips coupled to the command and address bus. In another embodiment, for each of the plurality of memory chips other than the first memory chip, the on-die termination control circuit of the memory chip is hardwired to a supply voltage line. In another embodiment, the plurality of memory chips include one or more dynamic random access memory (DRAM) chips.

Techniques and architectures for terminating bus lines are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. A dual in-line memory module (DIMM) comprising:
a plurality of stacked memory chips each to couple to a command address (CA) bus, the plurality of stacked memory chips including:
a first dynamic random access memory (DRAM) chip including:
first on-die termination (ODT) circuitry, and
a first CA ODT input coupled to the first ODT circuitry, the first CA ODT input strapped to a first voltage level to prevent provision of on-die termination to the CA bus by the first ODT circuitry; and
a second DRAM chip including:
second on-die termination (ODT) circuitry, wherein the second ODT circuitry is farther away from I/O contacts of the DIMM than on-die termination circuitry of other memory chips of the plurality of stacked memory chips, and
a second CA ODT input coupled to the second ODT circuitry, the second CA ODT input strapped to a second voltage level to cause only the second ODT circuitry to provide on-die termination to the CA bus.

2. The DIMM of claim 1, wherein:
the second DRAM chip is the only DRAM on the DIMM to provide termination for the CA bus.

3. The DIMM of claim 1, wherein:
the second DRAM chip is farther away from the I/O contacts of the DIMM than any other DRAM chip on the DIMM.

4. The DIMM of claim 1, wherein:
DRAM chips on the DIMM are coupled to the CA bus in series and the second DRAM chip is the last chip on the CA bus.

5. The DIMM of claim 1, wherein:
the first CA ODT input is strapped to VDD and the second CA ODT is strapped to VSS.

6. The DIMM of claim 1, wherein:
the first CA ODT input is strapped to VSS and the second CA ODT is strapped to VDD.

7. The DIMM of claim 1, wherein:
the first CA ODT input and the second CA ODT input are strapped inside the respective packages.

8. An apparatus comprising:
a plurality of stacked memory chips each to couple to a command address (CA) bus, the plurality of stacked memory chips including:

a first dynamic random access memory (DRAM) chip including:
  first on-die termination (ODT) circuitry, and
  a first CA ODT input coupled to the first ODT circuitry, the first CA ODT input strapped to a first voltage level to prevent provision of on-die termination to the CA bus by the first ODT circuitry; and
a second DRAM chip including:
  second on-die termination (ODT) circuitry, wherein the second ODT circuitry is farther away from I/O contacts of the apparatus than on-die termination circuitry of other memory chips of the plurality of stacked memory chips, and
  a second CA ODT input coupled to the second ODT circuitry, the second CA ODT input strapped to a second voltage level to cause only the second ODT circuitry to provide on-die termination to the CA bus.

9. The apparatus of claim 8, wherein:
the first DRAM chip and the second DRAM chip are on a circuit board.

10. The apparatus of claim 9, wherein:
the second DRAM chip is the only DRAM on the circuit board to provide termination for the CA bus.

11. The apparatus of claim 8, wherein:
the second DRAM chip is farther away from the I/O contacts any other DRAM chip coupled with the CA bus.

12. The apparatus of claim 9, wherein:
DRAM chips on the circuit board are coupled to the CA bus in series and the second DRAM chip is the last chip on the CA bus.

13. The apparatus of claim 8, wherein:
the first CA ODT input is strapped to VDD and the second CA ODT is strapped to VSS.

14. The apparatus of claim 8, wherein:
the first CA ODT input is strapped to VSS and the second CA ODT is strapped to VDD.

15. The apparatus of claim 8, wherein:
the first CA ODT input and the second CA ODT input are strapped inside the respective packages.

16. A system comprising:
a memory module including:
  a plurality of stacked memory chips each to couple to a command address (CA) bus, the plurality of stacked memory chips including:
    a first dynamic random access memory (DRAM) chip including:
      first on-die termination (ODT) circuitry, and
      a first CA ODT input coupled to the first ODT circuitry, the first CA ODT input strapped to a first voltage level to prevent provision of on-die termination to the CA bus by the first ODT circuitry; and
    a second DRAM chip including:
      second on-die termination (ODT) circuitry, wherein the second ODT circuitry is farther away from I/O contacts of the memory module than on-die termination circuitry of other memory chips of the plurality of stacked memory chips, and
      a second CA ODT input coupled to the second ODT circuitry, the second CA ODT input strapped to a second voltage level to cause only the second ODT circuitry to provide on-die termination to the CA bus; and
a processor coupled with the memory module.

17. The system of claim 16, wherein:
the second DRAM chip is the only DRAM on the memory module to provide termination for the CA bus.

18. The system of claim 16, wherein:
the second DRAM chip is farther away from the I/O contacts of the memory module than any other DRAM chip on the memory module.

19. The system of claim 16, wherein:
DRAM chips on the memory module are coupled to the CA bus in series and the second DRAM chip is the last chip on the CA bus.

20. The system of claim 16, further comprising:
a memory controller coupled with the memory module, the memory controller to send commands to the memory module.

* * * * *